United States Patent
Hosangadi et al.

(10) Patent No.: US 10,331,836 B1
(45) Date of Patent: Jun. 25, 2019

(54) LOOP OPTIMIZATION FOR IMPLEMENTING CIRCUIT DESIGNS IN HARDWARE

(71) Applicant: Xilinx, Inc., San Jose, CA (US)

(72) Inventors: Anup Hosangadi, San Jose, CA (US); Sumanta Datta, Hyderabad (IN); Aman Gayasen, Hyderabad (IN); Ashish Sirasao, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/730,431

(22) Filed: Oct. 11, 2017

(51) Int. Cl.
*G06F 17/50* (2006.01)
*H03K 19/173* (2006.01)

(52) U.S. Cl.
CPC ...... *G06F 17/5068* (2013.01); *G06F 17/5045* (2013.01); *H03K 19/1738* (2013.01)

(58) Field of Classification Search
USPC ........................................................ 716/104
See application file for complete search history.

(56) References Cited

U.S. PATENT DOCUMENTS

| 6,625,797 | B1 | 9/2003 | Edwards et al. |
| 9,619,601 | B1 | 4/2017 | Villarreal et al. |
| 2012/0144376 | A1 * | 6/2012 | Van Eijndhoven ..... G06F 8/456 717/146 |

* cited by examiner

*Primary Examiner* — Eric D Lee
(74) *Attorney, Agent, or Firm* — Kevin T. Cuenot

(57) ABSTRACT

Implementing a circuit design can include determining a chain of a plurality of loop elements of a circuit design, wherein each loop element includes a bit select node configured to perform a bit assignment operation and a corresponding address calculation node, wherein the address calculation nodes use a common variable to calculate a starting bit location provided to the corresponding bit select node. In response to the determining, the chain is replicated resulting in one chain for each value of the common variable and transforming each chain into a plurality of wires. A multiplexer is inserted into the circuit design. The plurality of wires for each chain is coupled to inputs of the multiplexer and the common variable is provided to the multiplexer as a select signal.

20 Claims, 10 Drawing Sheets

US 10,331,836 B1

LOOP OPTIMIZATION FOR IMPLEMENTING CIRCUIT DESIGNS IN HARDWARE

TECHNICAL FIELD

This disclosure relates to integrated circuits (ICs) and, more particularly, to optimizing loops for implementing circuit designs in hardware.

BACKGROUND

Circuit designs are typically written in a register transfer level (RTL) format. To implement the circuit design in hardware, e.g., circuitry, an electronic design automation (EDA) tool converts the RTL into an intermediate representation of the circuit design called a data flow graph (DFG). The DFG representation can be specified as a word-level representation or as a bit-level representation. The DFG defines the circuit architecture of the circuit design that is realized in physical circuitry.

In cases where the DFG includes bit-level assignments within a loop, the word-level representation of the DFG can become cumbersome to use. These problems are further exacerbated when the loop includes a chain of bit-assignments with variables in the bit index expression. This scenario often results in slower runtimes for the EDA tool and an inefficient circuit architecture for implementing the circuit design that requires significant circuit resources and significant area to implement.

SUMMARY

One or more embodiments are directed to methods for implementing a circuit design. In one aspect, a method can include determining, using a processor, a chain of a plurality of loop elements of a circuit design, wherein each loop element includes a bit select node configured to perform a bit assignment operation and a corresponding address calculation node, wherein the address calculation nodes use a common variable to calculate a starting bit location provided to the corresponding bit select node. The method can include, in response to the determining, replicating, using the processor, the chain resulting in one chain for each value of the common variable and transforming each chain into a plurality of wires. The method can include inserting, using the processor, a multiplexer into the circuit design and coupling, using the processor, the plurality of wires for each chain to inputs of the multiplexer. The common variable can be provided to the multiplexer as a select signal.

One or more embodiments are directed to systems for implementing a circuit design. In one aspect, a system includes a memory configured to store program code and a processor coupled to the memory. The processor, in response to executing the program code, is configured to initiate operations for implementing a circuit design. The operations can include determining a chain of a plurality of loop elements of a circuit design, wherein each loop element includes a bit select node configured to perform a bit assignment operation and a corresponding address calculation node, wherein the address calculation nodes use a common variable to calculate a starting bit location provided to the corresponding bit select node. The operations can include, in response to the determining, replicating the chain resulting in one chain for each value of the common variable and transforming each chain into a plurality of wires. The operations can also include inserting a multiplexer into the circuit design and coupling the plurality of wires for each chain to inputs of the multiplexer. The common variable can be provided to the multiplexer as a select signal.

One or more embodiments are directed to computer program products for implementing a circuit design. In one aspect, a computer program product includes a computer readable storage medium having program code stored thereon. The program code is executable by a processor to perform operations including determining a chain of a plurality of loop elements of a circuit design, wherein each loop element includes a bit select node configured to perform a bit assignment operation and a corresponding address calculation node, wherein the address calculation nodes use a common variable to calculate a starting bit location provided to the corresponding bit select node. The operations can include, in response to the determining, replicating the chain resulting in one chain for each value of the common variable and transforming each chain into a plurality of wires. The operations can include inserting a multiplexer into the circuit design and coupling the plurality of wires for each chain to inputs of the multiplexer. The common variable can be provided to the multiplexer as a select signal.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to optimizing loops for implementing circuit designs in hardware. Within some circuit designs, loop constructs are used to perform a variety of operations. A system, e.g., an electronic design automation (EDA) system, is capable of evaluating a circuit design to identify loop constructs included therein that meet predetermined criteria. In response to determining one or more loop constructs meet the criteria, the system is capable of modifying the circuit architecture of the circuit design.

In particular embodiments, the criteria include the loop construct having a body portion that performs one or more bit assignments. In particular embodiments, the criteria include the body portion of the loop construct using a common variable select for the bit(s) to be assigned in the body portion.

The system is capable of modifying the circuit architecture of the circuit design, at least with respect to the loop constructs found to meet the criteria, to generate a more efficient circuit architecture for the circuit design. The resulting circuit architecture is one that utilizes fewer circuit resources to implement the circuit design in hardware than is the case with other conventional techniques for processing and/or implementing the circuit design. In addition, the system itself is capable of operating in a more computationally efficient manner thereby reducing the runtime of the system when implementing the circuit design.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
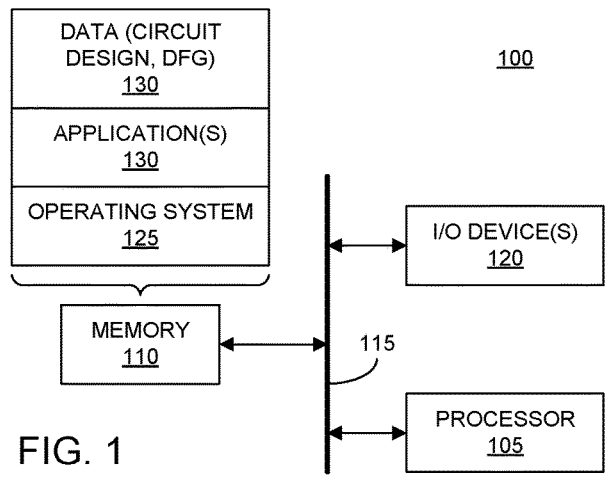
FIG. 1 illustrates an example of a data processing system for use with one or more embodiments described herein.

FIG. 1 illustrates an example of a data processing system (system) 100 for use with one or more embodiments described herein. In an aspect, system 100 is implemented as a computer or other system or device suitable for storing and/or executing program code. System 100 is an example of an EDA tool that is capable of performing the operations described herein to implement a circuit design in hardware.

System 100 includes at least one processor 105. Processor 105 is coupled to memory 110 through interface circuitry 115. System 100 stores computer readable instructions (also referred to as "program code") within memory 110. Memory 110 is an example of computer readable storage media. Processor 105 executes the program code accessed from memory 110 via interface circuitry 115.

Memory 110 includes one or more physical memory devices such as, for example, a local memory and one or more bulk storage devices. The term "local memory" refers to non-persistent memory device(s) generally used during actual execution of the program code. Examples of local memory include random access memory (RAM) and/or any of the various types of RAM that are suitable for use by a processor during execution of program code. The term "bulk storage device" refers to persistent data storage devices. Examples of a bulk storage device include a hard disk drive (HDD), flash memory, and a solid-state drive (SSD). System 100 may also include one or more cache memories (not shown) that provide temporary storage of at least some program code to reduce the number of times program code must be retrieved from a bulk storage device during execution.

Examples of interface circuitry 115 include, but are not limited to, an input/output (I/O) subsystem, an I/O interface, a bus system, and a memory interface. For example, interface circuitry 115 may be one or more of any of several types of bus structures, including a memory bus or memory controller, a peripheral bus, an accelerated graphics port, and a processor or local bus using any of a variety of bus architectures. By way of example, and not limitation, such bus architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

System 100 further is capable of including one or more input/output (I/O) devices 120 coupled to interface circuitry 115. I/O devices 120 may be coupled to system 100, e.g., interface circuitry 115, either directly or through intervening I/O controllers. Examples of I/O devices 120 include, but are not limited to, a keyboard, a display device, a pointing device, one or more communication ports, a network adapter, etc. A network adapter refers to circuitry that enables system 100 to become coupled to other systems, computer systems, remote printers, and/or remote storage devices through intervening private or public networks. Modems, cable modems, Ethernet cards, and wireless transceivers are examples of different types of network adapters that may be used with system 100.

Memory 110 stores one or more program modules. The program modules may generally include routines, programs, objects, components, logic, and/or other data structures. For purposes of illustration, memory 110 stores an operating system 125, one or more application(s) 130, and data 135. Data 135 can include a circuit design, a DFG, and/or other data described herein as used by system 100. In one or more embodiments, application(s) 130 include an EDA application.

Operating system 125 and application(s) 130, being implemented in the form of executable program code, are executed by system 100 and, more particularly, by processor 105. Application(s) 125, when executed, are capable of causing system 100 (e.g., processor 105) to perform the operations described within this disclosure. In one or more embodiments, application(s) 130 are capable of performing a design flow (e.g., synthesis, placement, routing, and/or bitstream generation) on a circuit design. As such, operating system 125 and application(s) 130 may be considered an integrated part of system 100. Any data used, generated, and/or operated upon by system 100 (e.g., processor 105) are functional data structures that impart functionality when employed as part of the system.

System 100 may include fewer components than shown or additional components not illustrated in FIG. 1 depending upon the particular type of device and/or system that is implemented. In addition, the particular operating system and/or application(s) included may vary according to device and/or system type as may the types of I/O devices included.

Further, one or more of the illustrative components may be incorporated into, or otherwise form a portion of, another component. For example, a processor may include at least some memory.

System 100 is capable of operating on a circuit design. In one or more embodiments, the circuit design is specified in a hardware description language (HDL). As an illustrative and non-limiting example, the circuit design may be specified in register transfer level (RTL) format.

In conventional circuit design implementation techniques, the loop construct is unrolled so that the resulting circuit architecture includes one instance of circuitry corresponding to the body portion of the loop construct for each iteration of the loop construct. These instances of circuitry are chained, or connected, together. Further, in cases where the body portion of the loop construct performs one or more bit assignments that utilize variables in the bit index expression, each instance of the circuitry further includes its own address calculation and bit select circuitry resulting in at least one multiplexer included in the resulting circuitry for each instance of the bit select circuit.

In one or more embodiments described herein, the system is capable of modifying the circuit architecture of the circuit design. The system is capable of identifying loop constructs within the circuit design that perform one or more bit assignments in the body of the loop construct and that have a common variable select. The bit assignments are performed on a one-dimensional array. The system is capable of implementing a circuit architecture where the address calculation circuitry and the bit select circuitry is pushed down to one final multiplexer that feeds the array. For example, the system is capable of moving the variable portion of the bit select circuitry to the final multiplexer. The final multiplexer is capable of enumerating, e.g., passing signals corresponding to, all possible values of the variables. Further details relating to the circuit architecture are described below in greater detail with reference to the remaining figures.

Figure 2:
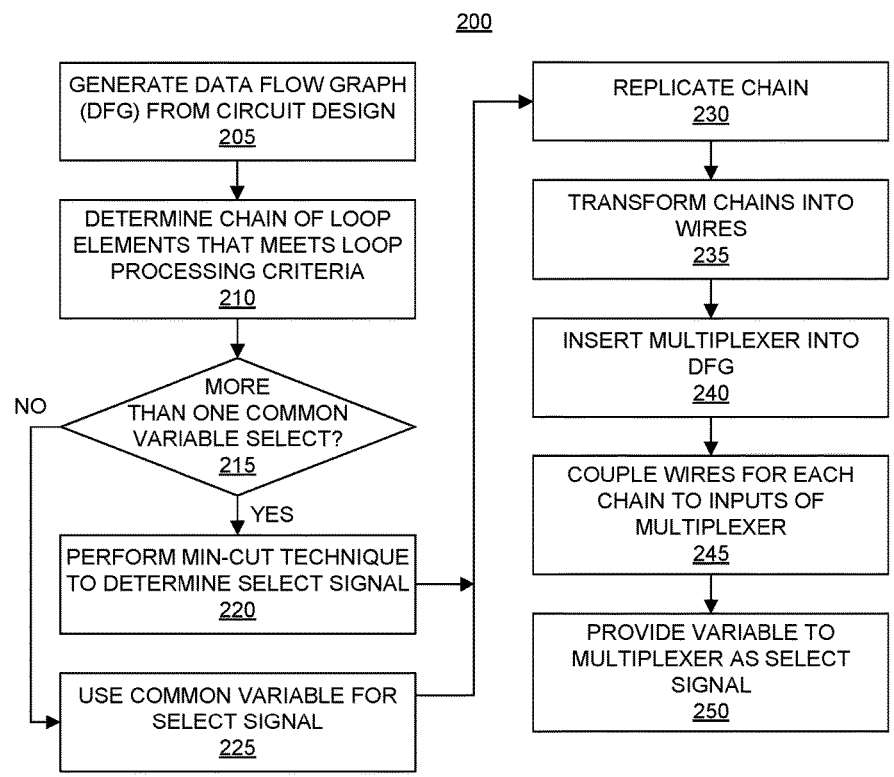
FIG. 2 illustrates an example method for implementing a circuit design.

FIG. 2 illustrates an example method 200 for implementing a circuit design. Method 200 can be performed using a data processing system such as system 100 described in connection with FIG. 1. Method 200 illustrates an example of a loop optimization technique that can be applied to circuit designs to improve runtime of the EDA tool and/or improve the quality of the resulting circuit design and hardware.

Method 200 can begin in block 205, where the system generates a DFG representation of the circuit design (hereafter "DFG"). A DFG is data structure that represents the circuit design where nodes of the DFG represent circuitry (e.g., circuit blocks) and edges of the DFG represent signals (e.g., wires) connecting the nodes. In particular embodiments, the DFG for the circuit design is a word-level DFG. In general, a DFG can be specified as a word-level representation or as a bit-level representation. A word-level DFG provides a more compact representation of circuitry than a bit-level DFG. A word-level DFG also enables faster runtimes for the EDA tool than a bit-level DFG.

In one or more embodiments, in generating the DFG for the circuit design, loop constructs found in the circuit design are unrolled. For example, each body portion of a loop construct is represented by a node or combination of nodes representing circuitry. For each iteration of the body portion of the loop construct, one instance of a loop node is generated in the DFG.

Within this disclosure, a loop node may include a single node or a plurality of interconnected nodes representing the body portion of the loop construct. A loop construct that has a body portion that iterates 3 times, for example, will have three instances of the loop node chained or coupled together in the DFG. In particular embodiments, the instances of the loop nodes for a given loop construct are directly connected together. In cases where the body portion of the loop construct performs one or more bit assignments that utilize variables in the bit index expression, each instance of the loop node includes an address calculation node and a bit select node.

With conventional circuit design implementation techniques, the address calculation node is implemented using circuitry that calculates the bit index expression including any variables used in the bit index expression from the RTL. In many cases, the circuitry implementing the address calculation node includes complex logic circuitry that, given a value of a variable, calculates a bit location used as the starting bit location for the bit assignments to be performed.

The bit select node represents circuitry that receives the bit location from the address calculation node and performs the bit assignment(s) starting at the received bit location. Each bit select node is often implemented as complex circuitry that includes a multiplexer. As such, the resulting circuit architecture for the unrolled loop includes a chain of interconnected multiplexers, where each multiplexer has complex address generation circuitry generating the select signal for the multiplexer. This circuit architecture is inefficient in that the number of circuit resources needed is large. The circuit architecture also requires significant area on an IC for implementation in hardware.

In block 210, the system determines a chain of loop elements that meets loop processing criteria. In one or more embodiments, the loop processing criteria specifies that each loop element of the chain performs one or more bit assignments. In particular embodiments, the bit assignment(s) are performed on a one-dimensional array. In particular embodiments, the loop processing criteria specifies that each loop element utilizes the same variable or variables for the bit index expression. When each loop element uses the same variable or same variables for the bit index expression, the variable(s) are said to be common among the loop elements.

In one or more embodiments, the system is capable of determining a chain of loop elements that meets the processing criteria by traversing the DFG. A loop element that meets the loop processing criteria includes a plurality of interconnected loop elements. Each loop element has a same structure. The loop elements are connected directly to one another, e.g., in a chain. In particular embodiments, each loop element of the chain includes a bit select node configured to perform a bit assignment. Each bit select node has a corresponding address calculation node. The address calculation nodes use a common variable or common variables to calculate the starting bit location that is provided to the corresponding bit select node. The corresponding bit select node begins performing the bit assignments at the starting bit location.

In block 215, the system determines whether the address calculation nodes of the loop constructs have more than one common variable select. In other words, the system determines whether the address calculation nodes of the loop elements use more one common variable or more than one common variable for the bit index expressions. In response to determining that the address calculation nodes use more than one common variable within the bit index expression, method 200 continues to block 220. In block 220, the system performs a min-cut technique to choose the particular variable, or variables, of the plurality of common variables to be used as the select signal. In response to determining that the address calculation nodes use one common variable with the bit index expression, method 200 continues to block 225, where the system chooses the common variable for the select signal.

In blocks 230-250, the system modifies the circuit architecture of the circuit design. In block 230, the system replicates the chain. The system is capable of replicating the chain of loop elements in the DFG so that the DFG, when done replicating, includes one chain for each value of the common variable. The system is capable of replicating the chain of loop elements in the DFG to result in one chain for each possible value of the common variable.

In block 235, the system is capable of transforming each chain into a plurality of wires. This transformation effectively prevents the implementation of complex circuitry for each address calculation node and the use complex circuitry including a multiplexer for each bit select node of each loop element. Instead, the circuit architecture is modified to utilize wires. The replication allows the address calculation nodes to be implemented as constants, which translates into wires, rather than complex circuitry that is implemented to calculate the bit index expression.

In block 240, the system is capable of inserting a multiplexer into the DFG. The system, for example, inserts a multiplexer, or a node representing a multiplexer, into the DFG. The multiplexer has an output that drivers the one-dimensional array, e.g., a memory representing the one-dimensional array.

In block 245, the system couples the wires for each chain to inputs of the multiplexer. Accordingly, the multiplexer receives each of the wires for each chain. The system, in general, moves the complex circuitry included in each of the loop elements of the chains to the inserted multiplexer that is coupled to, and feeds, the one-dimensional array that is being modified by the bit assignments.

In one or more embodiments, the number of choices for the multiplexer is equal to the number of unique values that the variable part of the address calculation circuitry can take. Each input provided to the multiplexer (e.g., each set of wires corresponding to a chain provided as an input) is a replication of the chain of bit select nodes. In making this adjustment, the address calculation circuitry becomes a constant. As such, the bit select node becomes a feedthrough wire node, thereby resulting in a more efficient circuit architecture that requires significantly fewer circuit resources than other conventional techniques.

In block 250, the system provides the common variable(s) selected in either block 220 or block 225 as the select signal. The system is capable of coupling a signal specifying the common variable(s) selected in block 220 or in block 225 to the select port of the multiplexer inserted in block 240.

Example 1 illustrates a portion of RTL for a circuit design. In one or more embodiments, the loop construct is implemented as a "for" loop, as is used in Example 1. In Example 1, the body portion of the loop construct includes a single line. The inventive arrangements described herein are not intended to be limited to the number of lines or statements (e.g., the complexity) of the body portion of the loop construct. In Example 1, the body portion of the loop construct iterates 3 times (e.g., from j=0 to j=2). Further, the body portion of the loop construct includes a bit index expression used to determine the starting bit location (or position) for the bit assignment operations to be performed. In Example 1, the bit index expression is "((j+3*var) to (j+3*var+2))". The bit index expression uses the common variable "var".

Figure 3:
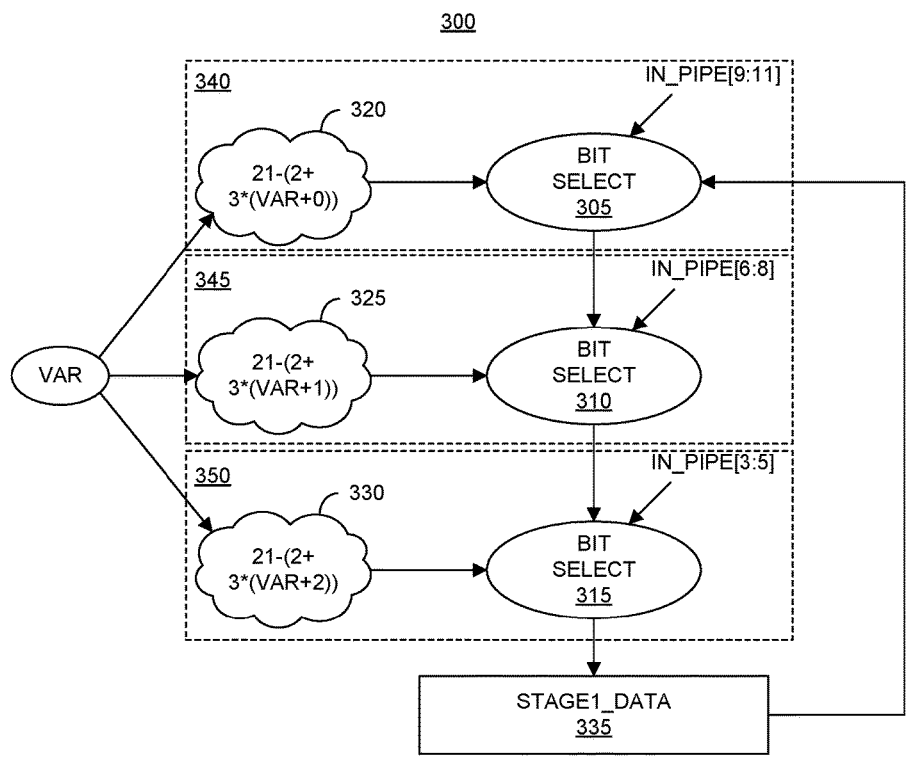
FIG. 3 illustrates an example data flow graph (DFG) for the register transfer level (RTL) of Example 1.

Example 1 signal Stage1_data: std_ulogic_vector(0 to 21);
signal var: natural range 0 to 3;
for j in 0 to 2 loop
Stage1_data((j+3*var) to (j+3*var+2)):=in_pipe(j*3 to j*3+2); end loop;

FIG. 3 illustrates an example DFG 300 for the RTL of Example 1. FIG. 3 is a simplified version of the DFG for purposes of illustration. In the example of FIG. 3, the "for" loop construct is unrolled. The bit assignments performed in the 3 iterations of the body portion of the loop are unrolled and implemented in DFG 300 as 3 separate instances of a bit select node shown as bit select nodes 305, 310, and 315. Each of bit select nodes 305, 310, and 315 typically maps to a circuit structure that includes a multiplexer within the resulting circuit design (e.g., the netlist) and/or resulting physical circuit implementation. Each bit select node 305-315 is capable of receiving the previous version of the array (e.g., Stage1_data) as input and writing a fixed number of bits to the array starting from a particular bit location. Each of bit select nodes 305-315 represents the bits written in each iteration of the body portion of the loop construct. As such, the number of bit select nodes is equal to the number of iterations of the loop construct.

In the example of FIG. 3, each bit select node 305, 310, and 315 has a corresponding address calculation node 320, 325, and 330. For example, bit select node 305 has corresponding address calculation node 320. Bit select node 310 has corresponding address calculation node 325. Bit select node 315 has corresponding address calculation node 330. Each of address calculation nodes 320, 325, and 330 is implemented as circuitry that is capable of calculating the bit index expression given the input variable "var." Each bit select node 305-315 begins writing at the starting bit location specified by the corresponding address calculation node 320.

For purposes of discussion, bit select node 305 and address calculation node 320 form a loop element 340; bit select node 310 and address calculation node 325 form a loop element 345; and bit select node 315 and address calculation node 330 form a loop element 350. Loop elements 340-350 are chained together in that bit select node 305 feeds, e.g., is directly coupled to, bit select node 310, and bit select node 310 feeds bit select node 315. Bit select node 315 feeds array node 335, which represents the one-dimensional array "Stage1_data". For example, array node 335 represents a memory such as a register or other circuit element that may be used to store the one-dimensional array "Stage1_data".

In the example of FIG. 3, bit assignments are shown in reverse from the RTL. For example, if an array range is given from 0 to 21 as in the case of "Stage1_data", the bit assignments start from 21 to 0 in reverse of the RTL array range. For that reason, address calculation nodes 320-330 subtract the expression from the value of 21.

Figure 4:
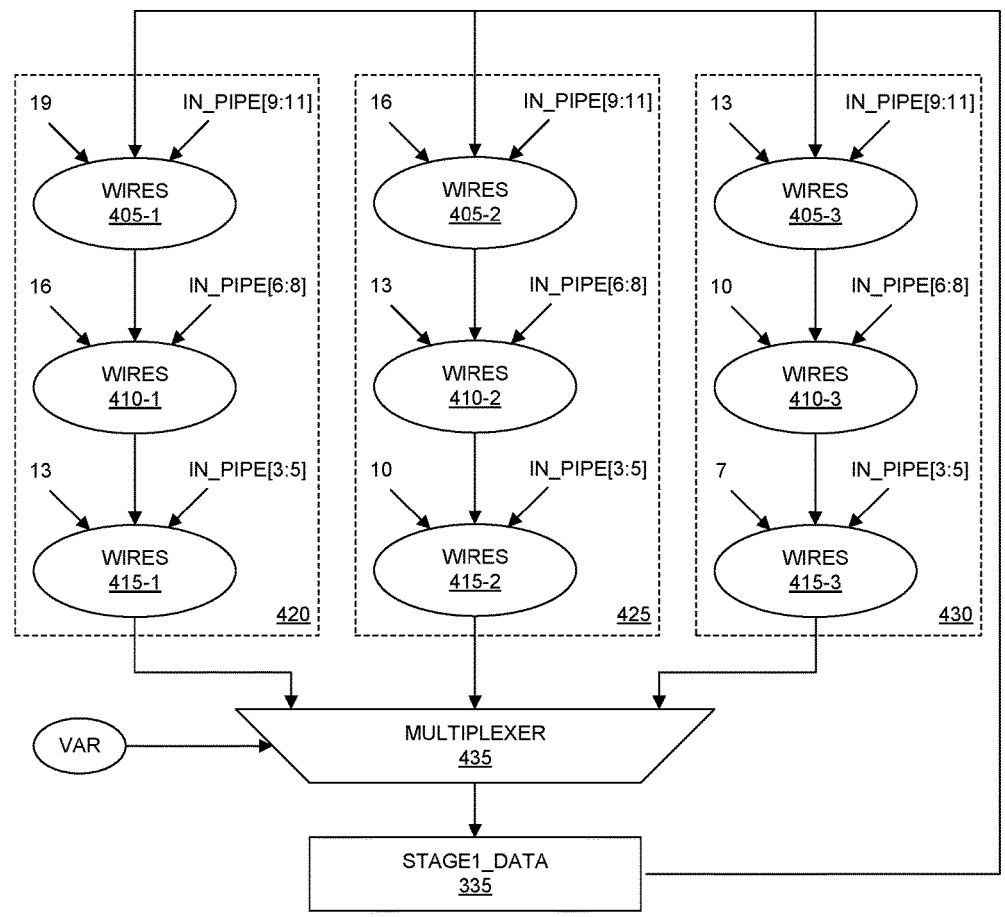
FIG. 4 illustrates an example modification to the circuit architecture of FIG. 3.

FIG. 4 illustrates a modified version of DFG 300 of FIG. 3. FIG. 4 illustrates the modified circuit architecture of the circuit design, as performed by a system such as system 100, through modification of DFG 300 of FIG. 3. In the example of FIG. 4, the chain of loop elements of FIG. 3 is replicated so that DFG 300 includes one chain 420, 425, and 430, e.g., one instance of the chain, for each value of the common variable. In this example, since the common variable "var" is defined in the RTL as having 3 possible values (e.g., 0, 1, and 2), the chain is replicated to result in 3 instances shown as chains 420, 425, and 430.

Within each of chains 420, 425, and 430, the bit select nodes (e.g., bit select nodes 305, 310, and 315) have been transformed into wires. Similarly, the address calculation nodes, due to the replication of the chains, become constants. As such, the address calculation circuitry represented by address calculation nodes 320, 325, and 330 becomes a constant as represented by a wire entering each of wire nodes 405, 410, and 415. For example, bit select node 305 is transformed into wires represented by wire nodes 405-1, 405-2, and 405-3 within each of chains 420, 425, and 430. Address calculation node 320 is transformed into the constants shown as "19" entering wire node 405-1, "16" entering wire node 405-2, and "13" entering wire node 405-3. Bit select node 310 is transformed into wires represented by wire nodes 410-1, 410-2, and 410-3 within each of chains 420, 425, and 430. Address calculation node 325 is transformed into the constants shown as "16" entering wire node 410-1, "13" entering wire node 410-2, and "10" entering wire node 410-3. Bit select node 315 is transformed into wires represented by wire nodes 415-2, 415-2, and 415-3 within each of chains 420, 425, and 430. Address calculation node 330 is transformed into the constants shown as "13" entering wire node 415-1, "10" entering wire node 415-2, and "7" entering wire node 415-3.

Rather than utilizing one multiplexer for each of the bit select nodes, the bit assignments are transformed into wires and the complex operations performed in FIG. 3 are moved to a multiplexer 435 that is inserted into DFG 300. The common variable "var" is provided to the multiplexer as a select signal. Accordingly, multiplexer 435 passes either the signals from chain 420, the signals from chain 425, or the signals from chain 430 on to array node 335, e.g., writes the passed signals to the memory, depending upon the value of "var".

As pictured, the address calculation nodes become constants that may be implemented as wires due to the replication of the chain. After replication, chain 420 corresponds to the case where var=0. Chain 425 corresponds to the case where var=1. Chain 425 corresponds to the case where var=2. Referring to chain 420, for example, the value calculated by address calculation node 320 when var=0 is known and can be used to choose which bits of Stage1_data to overwrite with in_pipe [9:11]. The value calculated by address calculation node 325 when var=0 is known and can be used to choose which bits of Stage1_data to overwrite with in_pipe[6:8]. The value calculated by address calculation node 330 when var=0 is known and can be used to choose which bits of Stage1_data to overwrite with in_pipe [3:5].

Due to the replication of the chain of loop elements for each possible value of the common variable used as the select signal for multiplexer 435 ("var" in this example), the circuitry used to calculate the bit index expressions can be implemented using wires instead of circuitry.

Figure 5:
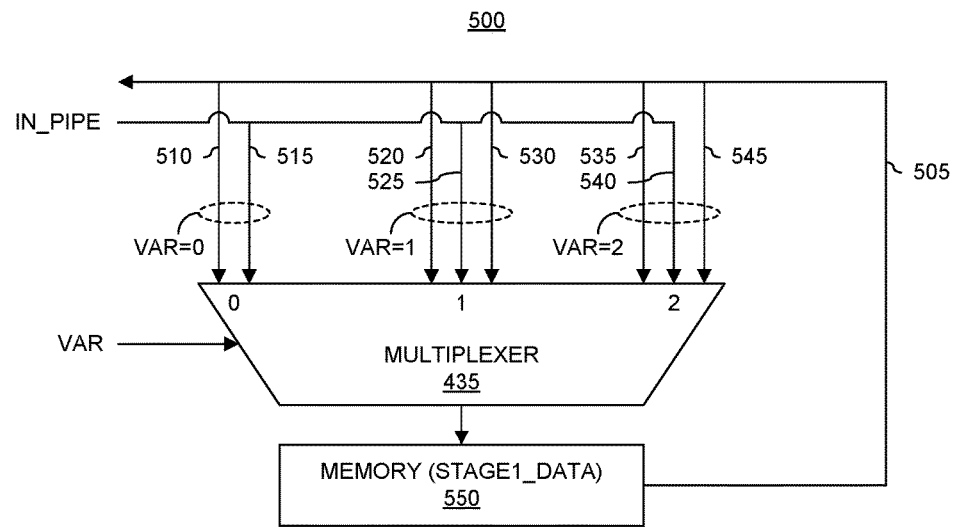
FIG. 5 illustrates example circuitry implemented from the modified circuit architecture shown in FIG. 4.

FIG. 5 illustrates example circuitry 500 implemented from the modified circuit architecture shown in FIG. 4. Circuitry 500 can be implemented within any of a variety of different types of ICs, e.g., as hardware, as described within this disclosure. In the example of FIG. 5, the wiring used to replace the bit select nodes and the address calculation nodes is shown. As pictured, the multiplexer includes 3 multibit inputs labeled 0, 1, and 2. When var=0, multiplexer 435 is capable of passing the signals received at input 0 to memory 550. When var=1, multiplexer 435 is capable of passing the signals received at input 1 to memory 550. When var=2, multiplexer 435 is capable of passing the signals received at input 2 to memory 550.

In the example of FIG. 5, signal 505 specifies bits 0-22 of the one-dimensional array Stage1_data stored in memory. Input 0 of multiplexer 435 receives signal 510 and signal 515. Signal 510 corresponds to Stage1_data(0 to 12) (e.g., bits 0 to 12) while signal 515 corresponds to in_pipe(3:11). Input 0 writes bits in_pipe(3:11) to bits 13-22 of Stage1_data. Input 1 of multiplexer 435 receives signals 520, 525, and 530. Signal 520 corresponds to Stage1_data(0 to 9) while signal 525 corresponds to in_pipe(3:11) and signal 530 corresponds to Stage1_data(19 to 21). Input 1 writes bits in_pipe(3:11) to bits 10-18 of Stage1_data. Input 2 of multiplexer 435 receives signals 535, 540, and 545. Signal 535 corresponds to Stage1_data(0 to 5) while signal 540 corresponds to in_pipe(3:11) and signal 545 corresponds to Stage1_data(16 to 21). Input 2 writes bits in_pipe (3:11) to bits 7-15 of Stage1_data.

The circuitry illustrated in FIG. 5 requires significantly fewer resources than the circuitry implemented from the example of FIG. 3. In particular, whereas FIG. 5 utilizes one multiplexer 435, the circuit architecture shown in FIG. 3 utilizes one multiplexer for each loop element. Further, each loop element in FIG. 3 requires address calculation circuitry that is reduced to constants and/or wires in FIG. 5.

The example embodiments described within this disclosure can be expanded to cover other, more complex circuit structures enumerated by the body portion of a loop construct. In one or more embodiments, the system is capable of analyzing the DFG to detect a chain of connected loop elements that have a common variable select and apply the same optimization techniques described herein in connection with FIGS. 2-5 to these more complex circuit structures.

Example 2 illustrates another portion of RTL for a circuit design. Example 2 illustrates that a loop element may have a structure that is more complex from the structure illustrated in Example 1. In Example 2, the RTL includes conditional statements within the body portion of the loop shown as an "if-then" statement. In Example 3, bits are written only when (e.g., "if") an enable condition is true.

Figure 6A:
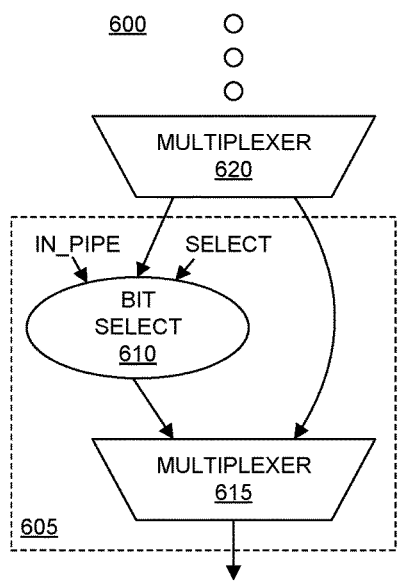
FIG. 6A illustrates an example DFG for the RTL of Example 2.

Example 2 for j in 0 to 2 loop
if(enable)
Stage1_data((j+3*var) to (j+3*var+2)):=in_pipe(j*3 to j*3+2);
end if;
end loop;

FIG. 6A illustrates another example DFG 600. FIG. 6A illustrates an example of a simplified DFG representation of the RTL shown in Example 2. As pictured, loop element 605 includes a bit select node 610 and a multiplexer 615. Bit select node 610 corresponds to the "if-then" branch, while the line directly coupling multiplexer 620 to multiplexer 615 represents the path taken when the if condition is not met. Multiplexer 615 passes either the signals on the left or the right based upon whether the "if" condition is true. Multiplexer 620 belongs to the loop element in the chain that feeds loop element 605. For ease of illustration, the address calculation node is not shown and the select signal is shown instead. Still, the value provided by the select signal is one that is calculated by circuitry capable of computing the bit index expression.

Referring to Example 2 and FIG. 6A, the bit index expression of "((j+3*var) to (j+3*var+2))" includes the common variable "var". In one or more embodiments, the circuit architecture illustrated in FIG. 6A can be modified using the same techniques described with reference to FIGS.

2-5 to reduce the size of the resulting circuitry and amount of circuit resources used. In general, the complex logic of each loop element (the address calculation node and multiplexer 615) is pushed to one final multiplexer that feeds the one-dimensional memory array. The number of choices of the multiplexer is equal to the number of values the variable portion of the address calculation logic can take. Each choice to the final multiplexer is a replication of the chain of bit select nodes with the address calculation nodes becoming constants.

Figure 6B:
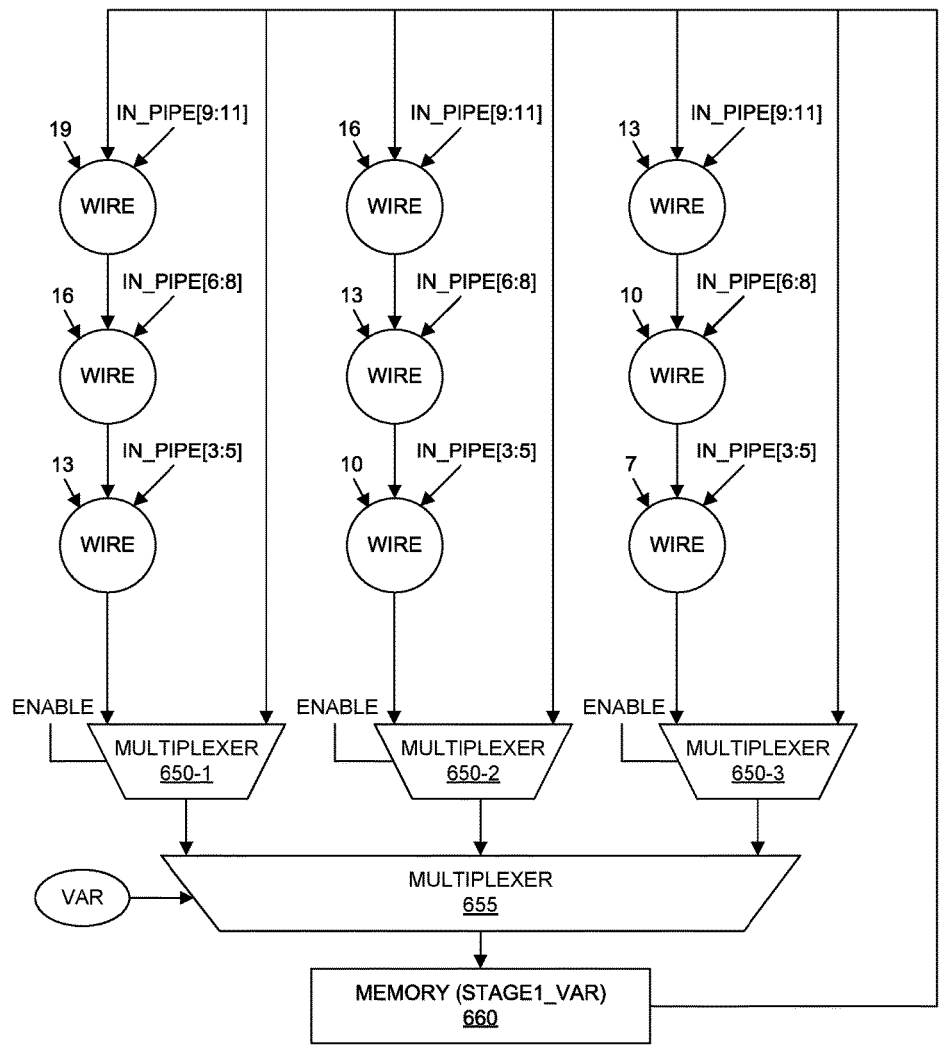
FIG. 6B illustrates an example circuit architecture for the DFG of FIG. 6A.

FIG. 6B illustrates an example circuit architecture for the DFG of FIG. 6A. In the example of FIG. 6B, the system includes an additional multiplexer 650 (shown as 650-1, 650-2, and 650-3) for each value of "var" that selects between the chain of bit select elements and a direct connection from memory 660 corresponding to the register storing stage1_data. The example circuit architecture of FIG. 6B corresponding to Example 2 illustrates that bits of "stage1_data" are written when the "enable" signal is true. Otherwise, the previous value of "stage1_data" is retained. The system creates multiplexer 655 coupled to the output of each of multiplexers 650-1, 650-2, and 650-3. The output of multiplexer 655 is coupled to memory 660.

Example 3 illustrates another portion of RTL for a circuit design. Example 3 illustrates that a loop element may have a structure that is more complex from the structure illustrated in Example 2. In Example 3, the RTL includes conditional statements within the body portion of the loop shown as an "if-then-else" statement. In Example 3, different bits of the data in the one-dimensional array are written depending upon the value of a condition. Further, the particular bits used to write to the selected bits of the one-dimensional array are different based upon the value of the condition.

Figure 7A:
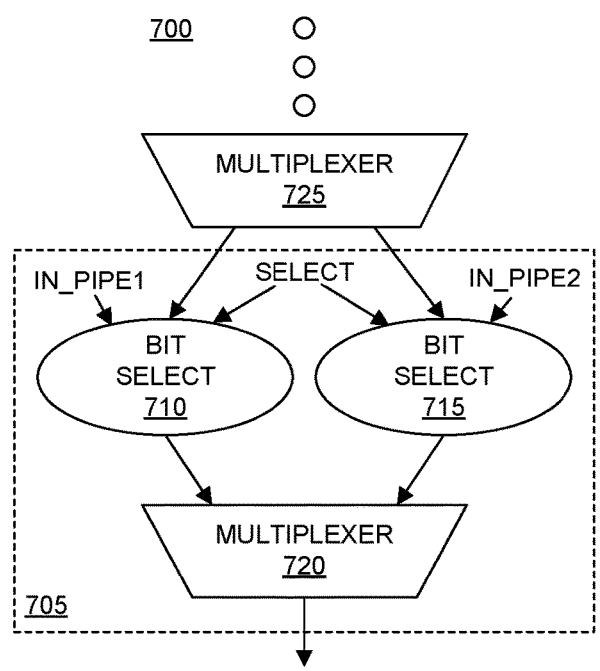
FIG. 7A illustrates an example DFG for the RTL of Example 3.

Example 3 for j in 0 to 2 loop
if(enable)
Stage1_data((j+3*var) to (j+3*var+2)):=in_pipe(j*3 to j*3+2);
else
Stage1_data((j+3*var) to (j+3*var++2)):=in_loop(j*3+ j*3+2);
end if;
end loop;

FIG. 7A illustrates another example DFG 700. FIG. 7A illustrates an example of a simplified DFG representation of the RTL shown in Example 3. As pictured, the loop element 705 includes 2 bit select nodes 710 and 715 corresponding to the "then" branch and the "else" branch of the "if-then-else" statement. Each of bit select nodes 710 and 715 feeds a multiplexer 720. Multiplexer 720 passes either the signals from bit select node 710 or the signals from bit select node 715 based upon whether the "if" condition is true. Multiplexer 725 belongs to the loop element in the chain that feeds loop element 705. For ease of illustration, the address calculation node is not shown and the select signal is shown instead. Still, the value provided by the select signal is one that is calculated by circuitry capable of computing the bit index expression.

Referring to Example 3 and FIG. 7A, the bit index expression of "((j+3*var) to (j+3*var+2))" and the bit index expression "((j+3*var) to (j+3*var++2))" each includes the common, or same, variable "var". In one or more embodiments, the circuit architecture illustrated in FIG. 7A can be modified using the same techniques described with reference to FIGS. 2-5 to reduce the size of the resulting circuitry and amount of circuit resources used. In general, the complex logic of each loop element (the address calculation nodes and multiplexer 720) is pushed to one final multiplexer that feeds the one-dimensional memory array. The number of choices of the multiplexer is equal to the number of values the variable portion of the address calculation logic can take. Each choice to the final multiplexer is a replication of the chain of bit select nodes with the address calculation nodes becoming constants.

Figure 7B:
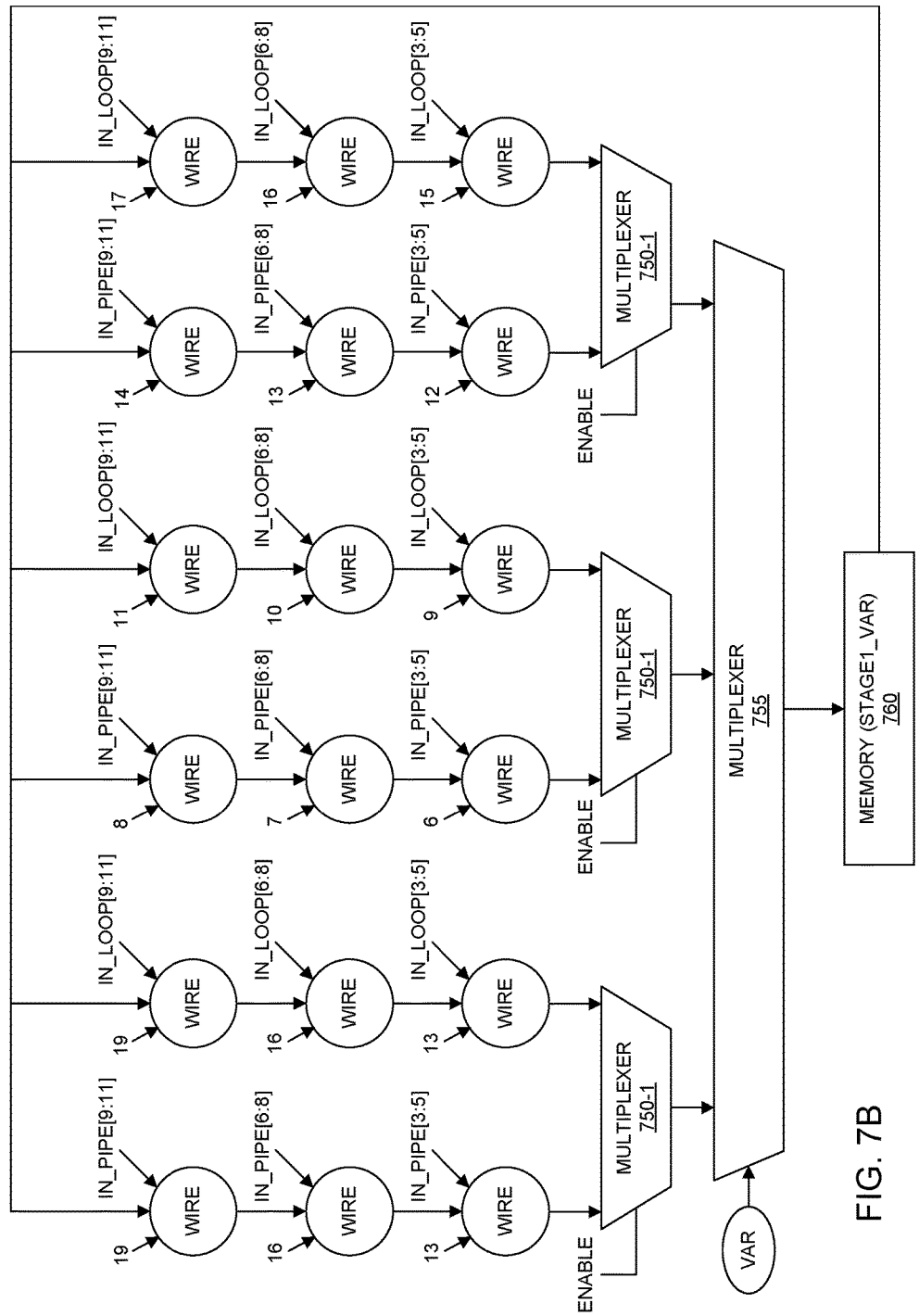
FIG. 7B illustrates an example circuit architecture for the DFG of FIG. 7A.

FIG. 7B illustrates an example circuit architecture for the DFG of FIG. 7A. In the example of FIG. 7B, the system includes an additional multiplexer 750 for each value of "var" that selects between a chain for the condition where enable is true (e.g., 1) and for the condition where enable is false (e.g., 0). The system creates multiplexer 755 coupled to the output of each of multiplexers 750-1, 750-2, and 750-3. The output of multiplexer 755 is coupled to memory 760.

Example 4 illustrates another portion of RTL for a circuit design. Example 4 illustrates that a loop element may have a structure that is more complex and that includes more than one common variable in the bit index expression. In Example 4, the RTL includes conditional statements within the body portion of the loop shown as an "if-then" statement. In addition, the bit index expression calculated by the address calculation circuitry utilizes the two common variables "var" and "tmp". As such, there is more than one common variable in the bit index expression.

Figure 8:
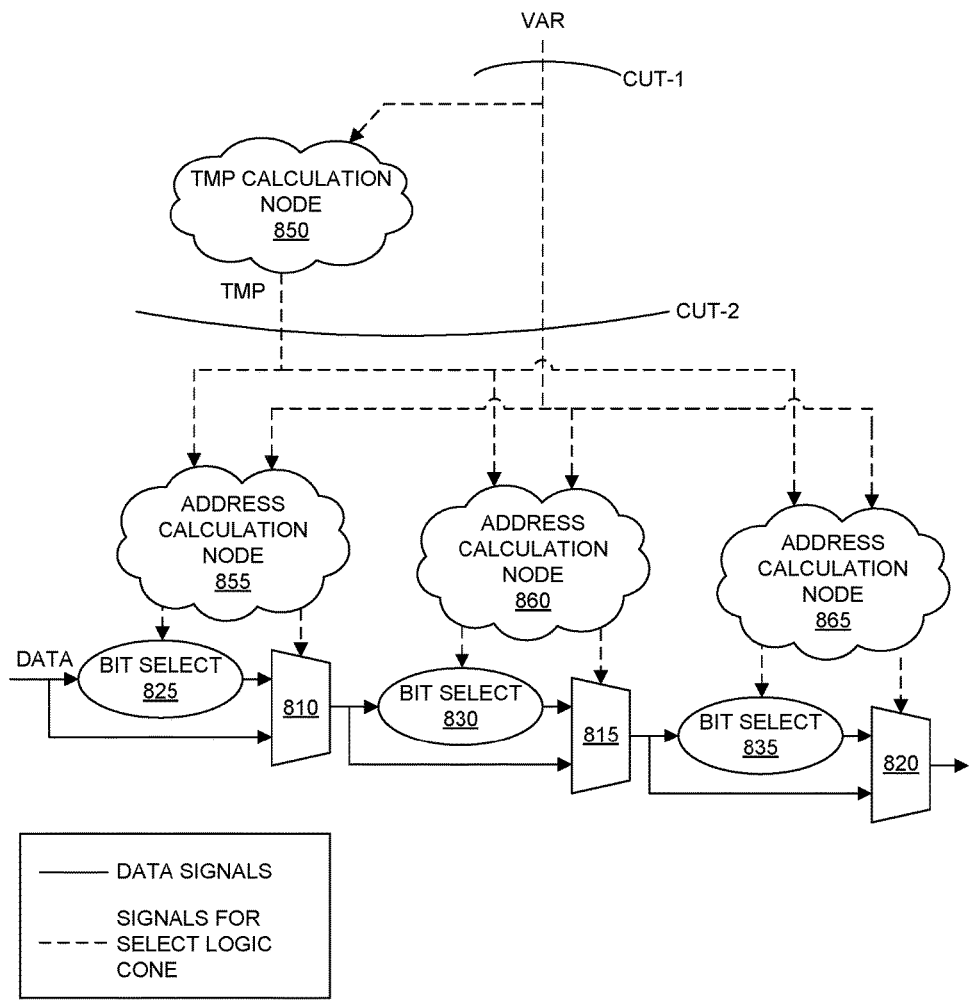
FIG. 8 illustrates an example DFG for the RTL of Example 4.

Example 4 signal stage1_var: std_ulogic_vector(0 to 21);
assign tmp=(var<=5) ? var*3:0;
for j in 0 to 2 loop
if (var<=5)
stage1_var((j+tmp) to ((j+tmp)+2)):=data((j*3 to (j*3)+2);
end loop;

FIG. 8 illustrates an example of a DFG 800. FIG. 8 illustrates an example of a simplified DFG representation of the RTL shown in Example 4. FIG. 8 is a simplified version of the DFG. In the example of FIG. 8, the DFG includes a tmp calculation node 850 and a plurality of address calculation nodes 855, 860, and 865. Tmp calculation node 850 represents circuitry that is capable of calculating the value of the variable "tmp" and providing the resulting value to address calculation nodes 855-865. For example, tmp calculation node 850 represents circuitry that is capable of implementing the RTL statement "assign tmp=(var<=5) ? var*3:0;" from Example 4.

Each respective address calculation node 855, 860, and 865 is capable of determining the starting bit location to be written by the corresponding bit select node 825, 830, and 835. Further, each respective address calculation node 855, 860, and 865 is capable of generating the select signal for a respective one of multiplexers 810, 815, and 820. In the example of FIG. 8, one loop element includes address calculation node 855, bit select node 825, and multiplexer 810. The next loop element includes address calculation node 860, bit select node 830, and multiplexer 815. The next loop element includes address calculation node 865, bit select node 835, and multiplexer 820.

In situations where there is more than one common variable in the bit select expression for each loop element, the system is capable of applying a min-cut technique to choose which of the plurality of common variables to use as the select signal for the multiplexer that is added to the circuit architecture. In one or more embodiments, the system uses a network flow model of the select logic cone to find a cut with a minimum variable width. In the example of FIG. 8, signals of the select logic cone are illustrated as dashed lines, while data signals are shown as solid lines. The signal that is cut with the minimum variable width is used as the select signal for the multiplexer.

Referring to FIG. 8, two potential cuts are shown as CUT-1 and CUT-2. CUT-1 cuts the signal corresponding to the variable "var". CUT-2 cuts the signals corresponding to the variables "tmp" and "var". Choosing CUT-1 results in a variable width of 3. Choosing CUT-2 results in a variable width of 6. It should be appreciated that the widths of the respective variables "tmp" and "var" is specified within the RTL. As such, the system is capable of automatically determining the variable widths for purposes of choosing CUT-1 or CUT-2. Choosing the cut with the minimum width leads to a smaller final multiplexer inserted into the circuit architecture. Thus, the system chooses CUT-1 in this example.

Figure 9:
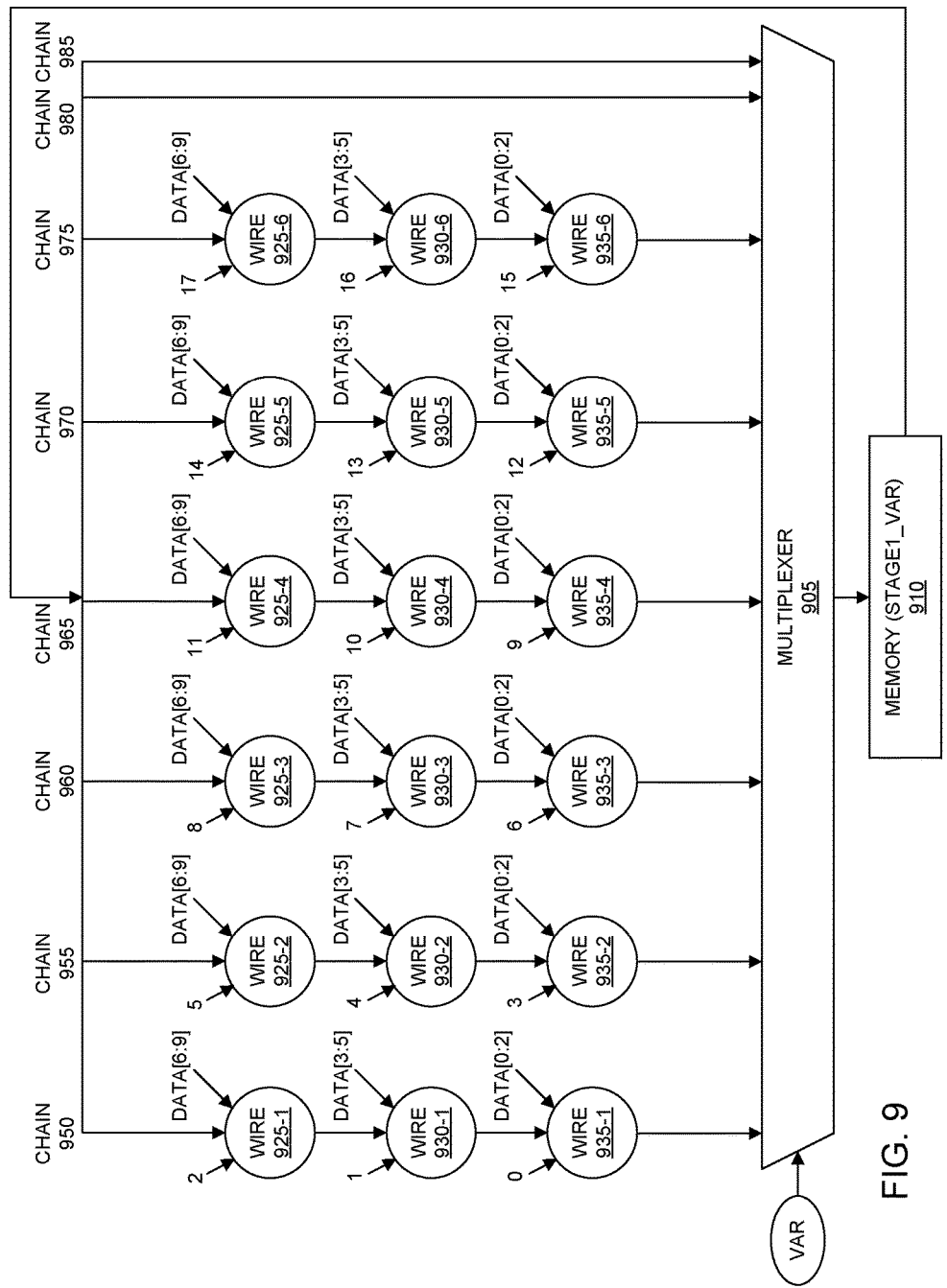
FIG. 9 illustrates an example circuit architecture.

FIG. 9 illustrates an example circuit architecture 900. The system is capable of implementing circuit architecture 900 for the RTL of Example 4 and the DFG of FIG. 8 after applying the modifications described herein. As illustrated, the bit-assignment nodes 825, 830, and 835 are replicated and converted into wires represented by wire nodes 925, 930, and 935, respectively. The chain of loop elements is replicated into chains 950, 955, 960, 965, 970, 975, 980, and 985.

The system adds multiplexer 905 into circuit architecture 900 and provides chains 950-985 as inputs to multiplexer 905. Further, the variable "var" is provided to multiplexer 905 as a select signal as determined by selecting CUT-1 from FIG. 8. Multiplexer 905 feeds memory 910, which stores the one-dimensional variable Stage1_var. The number of chains provided to multiplexer 905 as inputs is 8, which depends upon the bus width of the select signal provided to multiplexer 905. In this example, "var" has a width of 3, so the multiplexer has $2^3$ inputs. Tmp calculation node 850, which is not part of the loop elements, is optimized away (e.g., not included in the circuit architecture of FIG. 9) through constant propagation as the system enumerates over the select variable.

Table 1 illustrates results obtained by applying the loop optimization techniques described herein to reference circuit designs. Table 1 illustrates the significant number of circuit resources (e.g., circuit blocks or circuit components) that can be reduced for each of the reference circuit designs 1-4. By modifying the circuit architecture of the circuit designs as described, the number of circuit components such as flip-flops (FFs) and look-up tables (LUTs) can be reduced by factors of 10 or more in some cases.

TABLE 1

| Reference Circuit Design | Resource Usage - No Optimization | Resource Usage - With Optimization |
|---|---|---|
| 1 | FFs = 3082 | FFs = 3082 |
|   | LUTs = 101208 | LUTs = 7572 |
| 2 | FFs = 1605 | FFs = 1316 |
|   | LUTs = 7147 | LUTs = 634 |
| 3 | FFs = 540 | FFs = 360 |
|   | LUTs = 7350 | LUTs = 1155 |
| 4 | FFs = 108 | FFs = 108 |
|   | LUTs = 8750 | LUTs = 525 |

In accordance with the inventive arrangements described within this disclosure, a system is capable of transforming, or modifying, a circuit architecture of a circuit design to one that is structurally different, but functionally equivalent to the original circuit architecture. The resulting circuit architecture uses fewer circuit resources in the hardware implementation that results and requires less area, e.g., in an IC.

In addition, the example embodiments described herein address performance issues in processing circuit designs using a word-level loop optimizations. Utilization of the example embodiments serve to reduce the runtime of the system (e.g., the EDA tool) that is tasked with implementing the circuit design. In one aspect, for example, the system, in using the techniques described herein, is able to operate in a more computationally efficient manner when processing the circuit design. The system, in using a word-level representation, attempts to write the entire one-dimensional array at one time. Handling the bit-level assignments described herein using the word-level representations described (e.g., a word-level DFG) complicates processing of the DFG and slows execution of the system. By applying the techniques described herein, the bit-level assignments are handled in a computationally efficient manner while still realizing the performance benefits of using the word-level DFG representation (e.g., more compact representation of the circuitry requiring less memory and increased execution performance for other non-bit level processing). In another aspect, the reduction in the number of components achieved through application of the techniques described herein reduces the size of the circuit design thereby allowing the system to perform further operations such as synthesis, placement, routing, and/or bitstream generation in less time (e.g., in a more computationally efficient manner using less runtime) than would otherwise be the case.

In particular embodiments, a system as described herein is capable of operating on a circuit design as described herein for implementation within an IC. The IC may be a programmable IC. An example of an IC that can be programmed is a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs may also be implemented in other ways, e.g., using fuse or antifuse technology. The phrase "programmable IC" may include, but is not limited to, these devices and further may encompass devices that are only partially programmable. For example, one type of programmable IC includes a combination of hard-coded transistor logic and a programmable switch fabric that programmably interconnects the hard-coded transistor logic.

Figure 10:
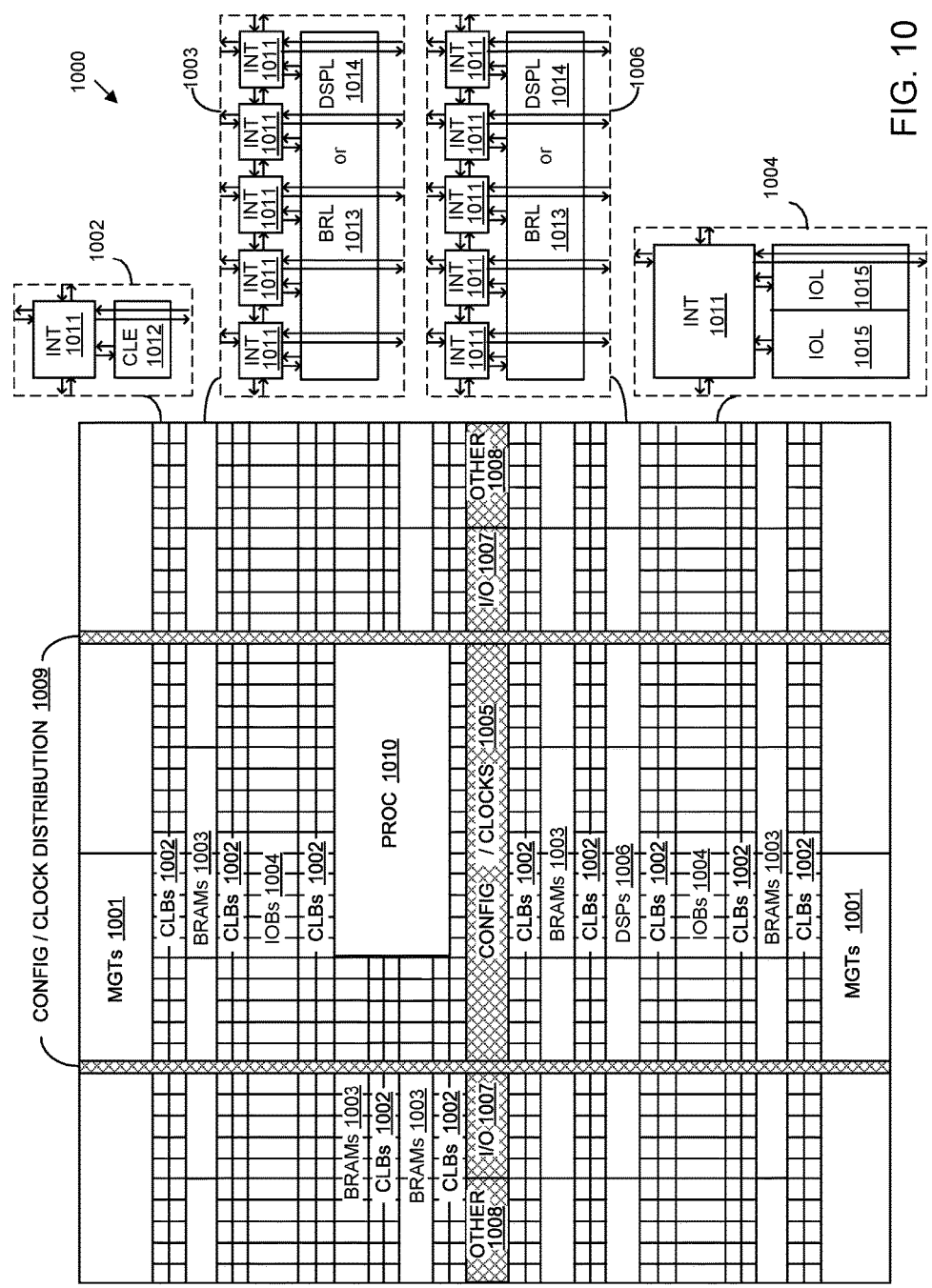
FIG. 10 illustrates an example of an architecture for an integrated circuit (IC).

FIG. 10 illustrates an example architecture 1000 for an IC. An IC having an architecture 1000 can be used to implement a circuit design having undergone loop processing as described within this disclosure. In one aspect, architecture 1000 may be implemented within a programmable IC. For example, architecture 1000 may be used to implement an FPGA. Architecture 1000 may also be representative of a system-on-chip (SOC) type of IC. An SOC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 1000 includes several different types of programmable circuit, e.g., logic, blocks. For example, architecture 1000 may include a large number of different programmable tiles including multi-gigabit transceivers (MGTs) 1001, configurable logic blocks (CLBs) 1002, random access memory blocks (BRAMs) 1003, input/output blocks (IOBs) 1004, configuration and clocking logic (CONFIG/CLOCKS) 1005, digital signal processing blocks (DSPs) 1006, specialized I/O blocks 1007 (e.g., configuration ports and clock ports), and other programmable logic 1008 such as digital clock managers, analog-to-digital converters, system monitoring logic, and so forth.

In some ICs, each programmable tile includes a programmable interconnect element (INT) 1011 having standardized connections to and from a corresponding INT 1011 in each adjacent tile. Therefore, INTs 1011, taken together, implement the programmable interconnect structure for the illustrated IC. Each INT 1011 also includes the connections to and from the programmable logic element within the same tile, as shown by the examples included at the top of FIG. 10.

For example, a CLB 1002 may include a configurable logic element (CLE) 1012 that may be programmed to implement user logic plus a single INT 1011. A BRAM 1003 may include a BRAM logic element (BRL) 1013 in addition to one or more INTs 1011. Typically, the number of INTs 1011 included in a tile depends on the height of the tile. As pictured, a BRAM tile has the same height as five CLBs, but other numbers (e.g., four) also may be used. A DSP tile 1006 may include a DSP logic element (DSPL) 1014 in addition to an appropriate number of INTs 1011. An IOB 1004 may include, for example, two instances of an I/O logic element (IOL) 1015 in addition to one instance of an INT 1011. The actual I/O pads connected to IOL 1015 may not be confined to the area of IOL 1015.

In the example pictured in FIG. 10, a columnar area near the center of the die, e.g., formed of regions 1005, 1007, and 1008, may be used for configuration, clock, and other control logic. Horizontal areas 1009 extending from this column may be used to distribute the clocks and configuration signals across the breadth of the programmable IC.

Some ICs utilizing the architecture illustrated in FIG. 10 include additional logic blocks that disrupt the regular columnar structure making up a large part of the IC. The additional logic blocks may be programmable blocks and/or dedicated circuitry. For example, a processor block depicted as PROC 1010 spans several columns of CLBs and BRAMs.

In one aspect, PROC 1010 may be implemented as dedicated circuitry, e.g., as a hardwired processor, that is fabricated as part of the die that implements the programmable circuitry of the IC. PROC 1010 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1010 may be omitted from architecture 1000 and replaced with one or more of the other varieties of the programmable blocks described. Further, such blocks may be utilized to form a "soft processor" in that the various blocks of programmable circuitry may be used to form a processor that can execute program code as is the case with PROC 1010.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 10 that are external to PROC 1010 such as CLBs 1002 and BRAMs 1003 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 1010.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SOC, the configuration bitstream may specify the circuitry that is to be implemented within the programmable circuitry and the program code that is to be executed by PROC 1010 or a soft processor. For example, the circuit architectures described herein can be implemented as a configuration bitstream that is loaded into an IC thereby implementing the circuitry described in the IC. In some cases, architecture 1000 includes a dedicated configuration processor that loads the configuration bitstream to the appropriate configuration memory and/or processor memory. The dedicated configuration processor does not execute user-specified program code. In other cases, architecture 1000 may utilize PROC 1010 to receive the configuration bitstream, load the configuration bitstream into appropriate configuration memory, and/or extract program code for execution.

FIG. 10 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 10 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1010 within the IC are for purposes of illustration only and are not intended as limitations.

In particular embodiments, the circuit architectures described herein can be implemented in other types of ICs that are not programmable. For example, the circuit architectures described herein can be implemented within hardwired ICs and/or application specific ICs.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code. The hardware circuit may be an integrated circuit. Examples of a processor include, but are not limited to, a central processing unit, an array processor, a vector processor, a digital signal processor, an FPGA, a programmable logic array, an application-specific IC, programmable logic circuitry, and a controller.

As defined herein, the term "output" means storing in physical memory elements, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

One or more embodiments are directed to methods for implementing a circuit design. In one aspect, a method can include determining, using a processor, a chain of a plurality of loop elements of a circuit design, wherein each loop element includes a bit select node configured to perform a bit assignment operation and a corresponding address calculation node, wherein the address calculation nodes use a common variable to calculate a starting bit location provided to the corresponding bit select node. The method can include, in response to the determining, replicating, using the processor, the chain resulting in one chain for each value of the common variable and transforming each chain into a plurality of wires. The method can include inserting, using the processor, a multiplexer into the circuit design and coupling, using the processor, the plurality of wires for each chain to inputs of the multiplexer. The common variable can be provided to the multiplexer as a select signal.

In an aspect, the circuit design, using the modified circuit architecture, is implemented within an integrated circuit.

In another aspect, the bit select nodes are configured to perform a bit assignment in a one-dimensional array and an output of the multiplexer is coupled to a memory configured to store the one-dimensional array.

In another aspect, the transforming of each chain into a plurality of wires includes replacing each bit select node of each loop element with wires and replacing each address calculation node of each loop element with a constant represented by a wire.

In another aspect, each address calculation node uses a plurality of common variables for calculating the address. The method can include performing a min-cut technique to select the common variable provided to the multiplexer as the select signal.

In another aspect, the min-cut technique determines a cut of a logic cone corresponding to the address calculation nodes, wherein the cut has a minimum variable width.

In another aspect, the bit select nodes conditionally perform the bit assignment.

In another aspect, the bit select nodes perform the bit assignment by writing different bits based upon a condition.

One or more embodiments are directed to systems for implementing a circuit design. In one aspect, a system includes a memory configured to store program code and a processor coupled to the memory. The processor, in response to executing the program code, is configured to initiate operations for implementing a circuit design. The operations can include determining a chain of a plurality of loop elements of a circuit design, wherein each loop element includes a bit select node configured to perform a bit assignment operation and a corresponding address calculation node, wherein the address calculation nodes use a common variable to calculate a starting bit location provided to the corresponding bit select node. The operations can include, in response to the determining, replicating the chain resulting in one chain for each value of the common variable and transforming each chain into a plurality of wires. The operations can also include inserting a multiplexer into the circuit design and coupling the plurality of wires for each chain to inputs of the multiplexer. The common variable can be provided to the multiplexer as a select signal.

In an aspect, the circuit design, using the modified circuit architecture, is implemented within an integrated circuit.

In another aspect, the bit select nodes are configured to perform a bit assignment in a one-dimensional array and an output of the multiplexer is coupled to a memory configured to store the one-dimensional array.

In another aspect, the transforming each chain into a plurality of wires includes replacing each bit select node of each loop element with wires and replacing each address calculation node of each loop element with a constant represented by a wire.

In another aspect, each address calculation node uses a plurality of common variables for calculating the address. Accordingly, the processor is configured to initiate operations further including performing a min-cut technique to select the common variable provided to the multiplexer as the select signal.

In another aspect, the min-cut technique determines a cut of a logic cone corresponding to the address calculation nodes, wherein the cut has a minimum variable width.

In another aspect, the bit select nodes conditionally perform the bit assignment.

In another aspect, the bit select nodes perform the bit assignment by writing different bits based upon a condition.

One or more embodiments are directed to computer program products for implementing a circuit design. In one aspect, a computer program product includes a computer readable storage medium having program code stored thereon. The program code is executable by a processor to perform operations including determining a chain of a plurality of loop elements of a circuit design, wherein each loop element includes a bit select node configured to perform a bit assignment operation and a corresponding address calculation node, wherein the address calculation nodes use a common variable to calculate a starting bit location provided to the corresponding bit select node. The operations can include, in response to the determining, replicating the chain resulting in one chain for each value of the common variable and transforming each chain into a plurality of wires. The operations can include inserting a multiplexer into the circuit design and coupling the plurality of wires for each chain to inputs of the multiplexer. The common variable can be provided to the multiplexer as a select signal.

In an aspect, the circuit design, using the modified circuit architecture, is implemented within an integrated circuit.

In another aspect, the bit select nodes are configured to perform a bit assignment in a one-dimensional array and an output of the multiplexer is coupled to a memory configured to store the one-dimensional array.

In another aspect, the transforming of each chain into a plurality of wires includes replacing each bit select node of each loop element with wires and replacing each address calculation node of each loop element with a constant represented by a wire.

In another aspect, each address calculation node uses a plurality of common variables for calculating the address. The method can include performing a min-cut technique to select the common variable provided to the multiplexer as the select signal.

In another aspect, the min-cut technique determines a cut of a logic cone corresponding to the address calculation nodes, wherein the cut has a minimum variable width.

In another aspect, the bit select nodes conditionally perform the bit assignment.

In another aspect, the bit select nodes perform the bit assignment by writing different bits based upon a condition.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:
1. A method for implementing a circuit design, comprising:
   determining, using a processor, a chain of a plurality of loop elements of a circuit design, wherein each loop element includes a bit select node configured to perform a bit assignment operation and a corresponding address calculation node, wherein the address calculation nodes use a common variable to calculate a starting bit location provided to the corresponding bit select node;

in response to the determining, replicating, using the processor, the chain resulting in one chain for each value of the common variable and transforming each chain into a plurality of wires;

inserting, using the processor, a multiplexer into the circuit design; and coupling, using the processor, the plurality of wires for each chain to inputs of the multiplexer, wherein the common variable is provided to the multiplexer as a select signal.

2. The method of claim 1, wherein the circuit design is implemented within an integrated circuit.

3. The method of claim 1, wherein the bit select nodes are configured to perform a bit assignment in a one-dimensional array and an output of the multiplexer is coupled to a memory configured to store the one-dimensional array.

4. The method of claim 1, wherein the transforming each chain into a plurality of wires comprises:

replacing each bit select node of each loop element with wires; and replacing each address calculation node of each loop element with a constant represented by a wire.

5. The method of claim 1, wherein each address calculation node uses a plurality of common variables for calculating the starting bit location, the method further comprising:

performing a min-cut technique to select the common variable provided to the multiplexer as the select signal.

6. The method of claim 5, wherein the min-cut technique determines a cut of a logic cone corresponding to the address calculation nodes, wherein the cut has a minimum variable width.

7. The method of claim 1, wherein the bit select nodes conditionally perform the bit assignment.

8. The method of claim 1, wherein the bit select nodes perform the bit assignment by writing different bits based upon a condition.

9. A system, comprising:

a memory configured to store program code; and a processor coupled to the memory, wherein the processor, in response to executing the program code, is configured to initiate operations for implementing a circuit design including:

determining a chain of a plurality of loop elements of a circuit design, wherein each loop element includes a bit select node configured to perform a bit assignment operation and a corresponding address calculation node, wherein the address calculation nodes use a common variable to calculate a starting bit location provided to the corresponding bit select node;

in response to the determining, replicating the chain resulting in one chain for each value of the common variable and transforming each chain into a plurality of wires;

inserting a multiplexer into the circuit design; and coupling the plurality of wires for each chain to inputs of the multiplexer, wherein the common variable is provided to the multiplexer as a select signal.

10. The system of claim 9, wherein the circuit design is implemented within an integrated circuit.

11. The system of claim 9, wherein the bit select nodes are configured to perform a bit assignment in a one-dimensional array and an output of the multiplexer is coupled to a memory configured to store the one-dimensional array.

12. The system of claim 9, wherein the transforming each chain into a plurality of wires comprises:

replacing each bit select node of each loop element with wires; and replacing each address calculation node of each loop element with a constant represented by a wire.

13. The system of claim 9, wherein each address calculation node uses a plurality of common variables for calculating the starting bit location, wherein the processor is configured to initiate operations further including:

performing a min-cut technique to select the common variable provided to the multiplexer as the select signal.

14. The system of claim 13, wherein the min-cut technique determines a cut of a logic cone corresponding to the address calculation nodes, wherein the cut has a minimum variable width.

15. The system of claim 9, wherein the bit select nodes conditionally perform the bit assignment.

16. The system of claim 9, wherein the bit select nodes perform the bit assignment by writing different bits based upon a condition.

17. A computer program product comprising a computer readable storage medium having program code stored thereon, the program code executable by a processor to perform operations for implementing a circuit design, comprising:

determining a chain of a plurality of loop elements of a circuit design, wherein each loop element includes a bit select node configured to perform a bit assignment operation and a corresponding address calculation node, wherein the address calculation nodes use a common variable to calculate a starting bit location provided to the corresponding bit select node;

in response to the determining, replicating the chain resulting in one chain for each value of the common variable and transforming each chain into a plurality of wires;

inserting a multiplexer into the circuit design; and coupling the plurality of wires for each chain to inputs of the multiplexer, wherein the common variable is provided to the multiplexer as a select signal.

18. The computer program product of claim 17, wherein the circuit design is implemented within an integrated circuit.

19. The computer program product of claim 17, wherein the bit select nodes are configured to perform a bit assignment in a one-dimensional array and an output of the multiplexer is coupled to a memory configured to store the one-dimensional array.

20. The computer program product of claim 19, wherein the transforming each chain into a plurality of wires comprises:

replacing each bit select node of each loop element with wires; and replacing each address calculation node of each loop element with a constant represented by a wire.

* * * * *